(12) United States Patent
Fisher et al.

(10) Patent No.: US 8,440,494 B2
(45) Date of Patent: May 14, 2013

(54) SINGLE-CRYSTALLINE SILICON ALKALINE TEXTURING WITH GLYCEROL OR ETHYLENE GLYCOL ADDITIVES

(75) Inventors: Kathryn C. Fisher, Brooklyn, NY (US); Jun Liu, Irvington, NY (US); Satyavolu S. Papa Rao, Poughkeepsie, NY (US); George G. Totir, Newtown, CT (US); James Vichiconti, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 13/112,465

(22) Filed: May 20, 2011

(65) Prior Publication Data
US 2012/0295390 A1 Nov. 22, 2012

(51) Int. Cl.
*H01L 21/00* (2006.01)
(52) U.S. Cl.
USPC ............ 438/71; 438/745; 257/E21.214
(58) Field of Classification Search ............... 438/497, 438/498, 747; 257/E21.224, E21.532
See application file for complete search history.

(56) References Cited

U.S. PATENT DOCUMENTS

| | | | |
|---|---|---|---|
| 6,197,611 B1 | 3/2001 | Nishimoto | |
| 7,446,051 B2 | 11/2008 | Young | |
| 7,494,936 B2 | 2/2009 | Ein-Eli et al. | |
| 7,828,983 B2 | 11/2010 | Weber et al. | |
| 7,858,426 B2 | 12/2010 | Cheong et al. | |
| 2008/0001243 A1* | 1/2008 | Otake et al. | 257/437 |

OTHER PUBLICATIONS

Mayer, K. et al., "New Surfactants for combined cleaning and texturing of mono-crystalline silicon wafers after wire-sawing", 23rd European Photovoltaic Solar Energy Conference and Exhibition, Sep. 1-5, 2008.
Fisher, K., et al., "Investigation of Low Molarity Alkaline Texturing Solutions", Proceedings of the 15th International Photovoltaic Science & Engineering Conference (PVSEC-15) Published : Oct. 1, 2005.

* cited by examiner

*Primary Examiner* — Cheung Lee
(74) *Attorney, Agent, or Firm* — Scully, Scott, Murphy & Presser, P.C.; Louis J. Percello, Esq.

(57) ABSTRACT

Alternative additives that can be used in place of isopropyl alcohol in aqueous alkaline etchant solutions for texturing a surface of a single-crystalline silicon substrate are provided. The alternative additives do not have volatile constituents, yet can be used in an aqueous alkaline etchant solution to provide a pyramidal shaped texture surface to the single-crystalline silicon substrate that is exposed to such an etchant solution. Also provided is a method of forming a textured silicon surface. The method includes immersing a single-crystalline silicon substrate into an etchant solution to form a pyramid shaped textured surface on the single-crystalline silicon substrate. The etchant solution includes an alkaline component, silicon (etched into the solution as a bath conditioner) and glycerol or ethylene glycol as an additive. The textured surface of the single-crystalline silicon substrate has (111) faces that are now exposed.

23 Claims, 4 Drawing Sheets

SINGLE-CRYSTALLINE SILICON ALKALINE TEXTURING WITH GLYCEROL OR ETHYLENE GLYCOL ADDITIVES

BACKGROUND

The present disclosure relates to semiconductor manufacturing, and more particularly, to a method for texturing a single-crystalline silicon substrate utilizing an aqueous alkaline etchant solution that includes an additive that has a higher boiling point than isopropyl alcohol.

A photovoltaic device is a device that converts the energy of incident photons to electromotive force (e.m.f.). Typical photovoltaic devices include solar cells, which are configured to convert the energy in the electromagnetic radiation from the Sun to electric energy.

In a typical solar cell, single-crystalline silicon is generally used as one of the components of the cell. In such applications, the single-crystalline silicon needs to have a non-planar surface to improve light capture. Typically, the non-planar surface has concave and convex patterns with a minute pyramid (i.e., square pyramid) shape. In such solar cells, the light reflected from one spot impinges again to another spot on the surface of the crystalline solar cell by virtue of the 'textured' surface, penetrating into the solar cell to be effectively absorbed in the solar cell. Although a portion of the impinging light that has not been fully absorbed, but arrives at the back face of the solar cell, is reflected back to the surface again, that portion of impinging light can be reflected again at the surface comprising steeply inclined pyramidal surfaces, thereby confining the light in the solar cell to improve absorption of light and to enhance power generation.

In conventional single-crystalline silicon solar cells, the textured structure is formed by immersing the exposed (100) face of a single-crystalline silicon wafer into a mixed solution prepared by adding 5 to 30% by volume of isopropyl alcohol into an aqueous solution of an alkaline, i.e., sodium hydroxide (NaOH) or potassium hydroxide (KOH), which may also include some added silicon. Etching in this mixed solution is performed at a temperature of from 70° C. to 95° C.

The etching rate in anisotropic etchants of the kind described above depends on the crystallographic orientation of the silicon surface being etched. The etching rate on the (111) face is significantly lower than the other crystallographic orientations. Accordingly, the (111) face with the slowest etching rate is advantageously left on the surface. Since this (111) face is inclined by about 54 degree against the (100) face, pyramidal projections constituted of the (111) face and its equivalent faces are formed. The pyramid size and density depends on the KOH or NaOH concentration, the amount of added silicon already dissolved in the bath, and additive such as isopropyl alcohol.

However, due to the high processing temperature, typically around 80° C., isopropyl alcohol, with a low boiling point of 82.5° C., volatilizes constantly. Hence, special equipment is needed to be used to capture the vapors, and the bath needs to be continuously replenished with isopropyl alcohol. Additionally, isopropyl alcohol is known to be flammable with a very low flash point. Such process and tool complexities add to the cost of solar cell fabrication.

SUMMARY

The present disclosure provides alternative additives that can be used in place of isopropyl alcohol in aqueous alkaline etchant solutions for texturing a surface of a single-crystalline silicon substrate. The alternative additives of the present disclosure do not have volatile constituents, yet can be used in an aqueous alkaline etchant solution to provide a pyramidal shaped textured surface to the single-crystalline silicon substrate that is exposed to such an etchant solution.

Moreover, the alternative additives of the present disclosure provide an aqueous alkaline etchant solution that has a comparable or lower reflectance as compared to a pure dilute alkaline etchant solution that does not include any additive. Furthermore, the alternative additives of the present disclosure provide an aqueous alkaline etchant solution that has a lower etch rate (typically 10-20%) as compared to the etch rate using a pure dilute alkaline etchant solution that does not include any additive. Since the aqueous alkaline etchant solution with the disclosed additives has a low etch rate associated therewith, there is less overall silicon loss in order to generate the pyramid shaped textured surface having the same reflectance when compared with a similar single-crystal silicon substrate processed in a dilute alkaline solution without alcohol additives. Such a low Si etching rate can also lengthen the bath life, permitting more silicon wafers to be textured before the bath needs to be replenished with alkali.

In one embodiment of the present disclosure, a method of texturing a surface of a single-crystalline silicon substrate is provided in which glycerol is used as an additive for an aqueous alkaline etchant solution. In this embodiment, the method of the present disclosure includes immersing a single-crystalline silicon substrate into an etchant solution to form a pyramid shaped textured surface on the single-crystalline silicon substrate, wherein the etchant solution includes an aqueous alkaline etchant solution including glycerol as an additive. The textured surface of the single-crystalline silicon substrate has (111) faces that are now exposed.

In another embodiment of the present disclosure, a method of texturing a surface of a single-crystalline silicon substrate is provided in which ethylene glycol is used as an additive for an aqueous alkaline etchant solution. In this embodiment, the method of the present disclosure includes immersing a single-crystalline silicon substrate into an etchant solution to form a pyramid shaped textured surface on the single-crystalline silicon substrate, wherein the etchant solution is an aqueous alkaline etchant solution including ethylene glycol as an additive. The textured surface of the single-crystalline silicon substrate has (111) faces that are now exposed.

In yet another embodiment, the present disclosure relates to an aqueous alkaline etchant solution for texturing a surface of a single-crystalline silicon substrate. The aqueous alkaline etchant solution of the present disclosure includes 1 weight percent to 5 weight percent of an alkaline, 0.3 weight percent to 1.5 weight percent of silicon, 3 weight percent to 15 weight percent of an additive and the remainder water. The alkaline component of the disclosed etchant solution is selected from the group consisting of potassium hydroxide (KOH), sodium hydroxide (NaOH), choline hydroxide, tetramethylammonium hydroxide (TMAH) and tetraethylammonium hydroxide (TEAH), while the additive of the disclosed etchant solution is selected from the group consisting of glycerol and ethylene glycol.

DETAILED DESCRIPTION

The present disclosure, which provides a method of texturing a single-crystalline silicon surface, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present disclosure provides alternative additives that can be used in place of isopropyl alcohol in aqueous alkaline etchant solutions for texturing a surface of a single-crystalline silicon substrate. The alternative additives of the present disclosure do not have volatile constituents, yet can be used in an aqueous alkaline etchant solution to provide a pyramidal shaped textured surface to the single-crystalline silicon substrate that is exposed to such an etchant solution. Also provided is a method of forming a textured silicon surface. The method includes immersing a single-crystalline silicon substrate into an etchant solution to form a pyramid shaped textured surface on the single-crystalline silicon substrate. The etchant solution includes an alkaline component, silicon (previously etched into the solution as a bath conditioner) and glycerol or ethylene glycol as an additive. The textured surface of the single-crystalline silicon substrate has (111) faces that are now exposed.

Figure 1:
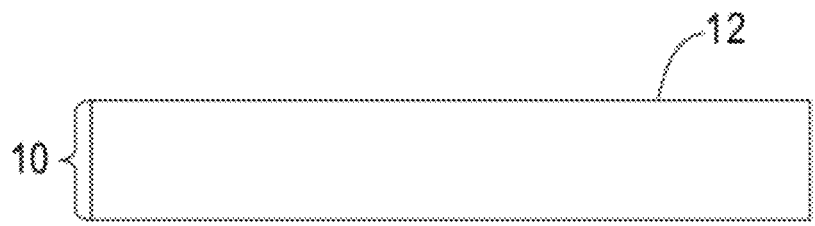
FIG. 1 is a pictorial representation (through a cross sectional view) illustrating a single-crystalline silicon substrate that can be employed in one embodiment of the present disclosure.
Figure 2:
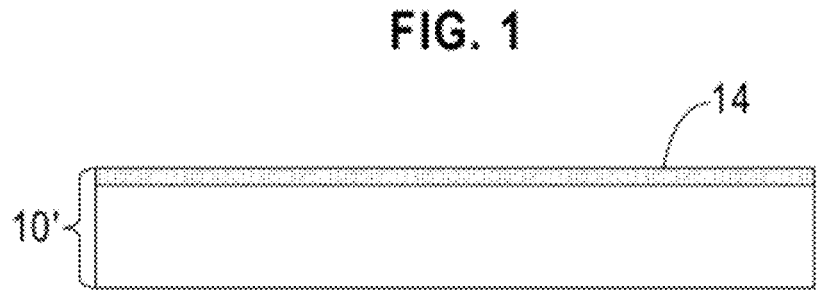
FIG. 2 is a pictorial representation (through a cross sectional view) illustrating the structure shown in FIG. 1 after immersing the single-crystalline silicon substrate in an etchant solution in accordance with the present disclosure.

Reference is first made to FIGS. 1-2 which illustrate a single-crystalline silicon substrate prior to etching and after etching using an etchant solution in accordance with the present disclosure. Specifically, FIG. 1 illustrates a single-crystalline silicon substrate 10 which has an exposed (100) oriented surface, i.e., face, 12. The term "single-crystalline silicon" denotes any silicon substrate in which the crystal lattice of the entire substrate is continuous and unbroken to the edges of the substrate, with no grain boundaries.

The single-crystalline silicon substrate 10 can be fabricated using methods that are well known in the art. In one embodiment, the single-crystalline silicon substrate 10 can be formed by Czochralski or other techniques using directional solidification. In another embodiment, the single-crystalline silicon substrate 10 can be a thin film of single-crystal silicon that is grown on top of a substrate (for example, by epitaxial techniques).

In some embodiments, the single-crystalline silicon substrate 10 is non-doped. In other embodiments, the single-crystalline silicon substrate 10 is doped with either a p-type dopant or an n-type dopant. As used throughout the present application, "p-type" refers to the addition of impurities to an intrinsic semiconductor that creates deficiencies of valence electrons. In a single-crystalline silicon substrate, examples of p-type dopants, i.e., impurities, include but are not limited to, boron, aluminum, gallium and indium. In one embodiment in which the single-crystalline silicon substrate 10 includes p-type dopant, the p-type dopant is present in a concentration ranging from $1 \times 10^9$ atoms/cm$^3$ to $1 \times 10^{20}$ atoms/cm$^3$. In another embodiment in which the single-crystalline silicon substrate 10 includes a p-type dopant, the p-type dopant is present in a concentration ranging from $1 \times 10^{14}$ atoms/cm$^3$ to $1 \times 10^{19}$ atoms/cm$^3$. As used throughout the present application, "n-type" refers to the addition of impurities that contributes free electrons to an intrinsic semiconductor. In a single-crystalline silicon substrate, examples of n-type dopants, i.e., impurities, include but are not limited to, antimony, arsenic and phosphorous. In one embodiment in which the single-crystal silicon substrate 10 includes an n-type dopant, the n-type dopant is present in a concentration ranging from $1 \times 10^9$ atoms/cm$^3$ to $1 \times 10^{20}$ atoms/cm$^3$. In another embodiment in which the single-crystal silicon substrate 10 includes an n-type dopant, the n-type dopant is present in a concentration ranging from $1 \times 10^{14}$ atoms/cm$^3$ to $1 \times 10^{19}$ atoms/cm$^3$.

In one embodiment, the single-crystalline silicon substrate 10 of FIG. 1 can be an element of any photovoltaic device, such as, for example, an element of solar cell. In the case of solar cell applications, the single-crystalline silicon substrate 10 needs to have a non-planar surface to improve light capture within the single-crystalline silicon substrate 10.

After providing the single-crystalline silicon substrate 10, the single-crystalline silicon substrate 10 is textured by immersing the same in an etchant solution of the present application to form a pyramid shaped textured surface. In some embodiments, the pyramid textured surface increases the surface area of the etched single-crystalline silicon substrate. In another embodiment, the pyramid shaped textured surface decreases the reflectance of the etched single-crystalline silicon substrate. In yet another embodiment, the pyramid textured surface increases the surface area of the etched single-crystalline silicon substrate as well as decreases the reflectance of the etched single-crystalline silicon substrate.

FIG. 2 illustrates the resultant structure of FIG. 1 after texturing the single-crystalline silicon substrate 10. In FIG. 2, reference numeral 10' denotes the etched single-crystalline silicon substrate, and reference numeral 14 denotes the pyramid shaped textured surface that is a result of the immersing. The textured surface of the single-crystalline silicon substrate has (111) faces that are now exposed.

The etchant solution employed in the present disclosure uses alternative additives other than isopropyl alcohol, which do not contain volatile constituents. In one embodiment of the present disclosure, the etchant solution used for texturing the single-crystalline silicon substrate 10 includes an aqueous alkaline etchant solution comprising glycerol as an additive. In another embodiment of the present disclosure, the etchant solution used for texturing the single-crystalline silicon substrate 10 includes an aqueous alkaline etchant solution comprising ethylene glycol as an additive.

In one embodiment and when glycerol is present in the aqueous alkaline etchant solution, glycerol is present in a concentration of from 3 weight percent to 15 weight percent. In another embodiment and when glycerol is present in the aqueous alkaline etchant solution, the glycerol is present in a concentration of from 5 weight percent to 10 weight percent.

In one embodiment and when ethylene glycol is present in the aqueous alkaline etchant solution, ethylene glycol is present in a concentration of from 3 weight percent to 15 weight percent. In another embodiment and when ethylene glycol is present in the aqueous alkaline etchant solution, the ethylene glycol is present in a concentration of from 5 weight percent to 10 weight percent.

In either embodiment mentioned above, the aqueous alkaline etchant solution also comprises potassium hydroxide (KOH), sodium hydroxide (NaOH), choline hydroxide, tetramethylammonium hydroxide (TMAH) or tetraethylammonium hydroxide (TEAH) as an alkaline component. In one embodiment, the alkaline component is present in the aqueous alkaline etchant solution in a concentration of from 1 weight percent to 5 weight percent. In another embodiment, the alkaline component is present in the aqueous alkaline etchant solution in a concentration of from 2 weight percent to 4 weight percent.

In addition to including an alkaline component and glycerol or ethylene glycol as an additive, the aqueous alkaline etchant solution also includes silicon. Silicon is typically etched into the aqueous alkaline etchant solution as a bath conditioner. In one embodiment of the present disclosure, the silicon is present in the aqueous alkaline etchant solution in a concentration of from 0.3 weight percent to 1.5 weight percent. In another embodiment of the present disclosure, the silicon is present in the aqueous alkaline etchant solution in a concentration of from 0.5 weight percent to 1.0 weight percent.

In accordance with the present disclosure, the remainder of the aqueous alkaline etchant solution is water (typically deionized water). As such, water is present in amount such that its sum with the alkaline component, the additive, and silicon adds up to 100%. Also, the alkaline component, the additive, silicon and water constituent the entirety of the etchant solution of the present disclosure. As such, and in one embodiment of the present disclosure, the aqueous alkaline etchant solution contains 1 weight percent to 5 weight percent of an alkaline, 0.3 weight percent to 1 weight percent of silicon, 3 weight percent to 15 weight percent of glycerol and the remainder water. In another embodiment of the present disclosure, the aqueous alkaline etchant solution contains 1 weight percent to 5 weight percent of an alkaline, 0.3 weight percent to 1 weight percent of silicon, 3 weight percent to 15 weight percent of ethylene glycol and the remainder water.

The aqueous alkaline etchant solution can be formed by various methods. For example and in one embodiment, the etchant solution can be prepared by first providing the alkaline component, admixing water to the concentration for the texturing process, then etching silicon into the solution at an enhanced temperature, e.g., 70°-90° C., and thereafter admixing the additive. In another embodiment, the etchant solution can be prepared by first providing the alkaline component, admixing a lower amount of water to a higher concentration than that needed for the texturing process, then etching silicon into the solution at an enhanced temperature, e.g., 70°-90° C., and thereafter admixing more water to dilute to the desired concentration for the texturing process, and lastly admixing the additive. During the admixing step, stifling is typically employed to provide a homogeneous mixture of components.

As stated above, the single-crystalline silicon substrate 10 is textured by immersing the same in the aqueous alkaline etchant solution. In one embodiment, the immersing is performed at a temperature from 70° C. to 90° C. In another embodiment, the immersing is performed at a temperature from 75° C. to 85° C. The term "immersing" denotes that at least surface 12 of the single-crystalline silicon substrate 10 is placed into a bath that includes the aqueous alkaline etchant solution mentioned above.

In one embodiment, the duration of the immersing of the single-crystalline silicon substrate 10 into the aqueous etchant solution is from 10 minutes to 60 minutes. In another embodiment, the duration of the immersing of the single-crystalline silicon substrate 10 into the aqueous etchant solution is from 15 minutes to 30 minutes.

When the above conditions are employed for texturing a single-crystalline silicon substrate, the aqueous alkaline etchant solution of the present disclosure typically has an etch rate from 0.1 μm/min to 1.0 μm/min. More typically, the aqueous alkaline etchant solution of the present disclosure has an etch rate from 0.25 μm/min to 0.40 μm/min.

Additional texturing can be performed as deemed necessary by repeating the immersing step mentioned above.

Moreover, the alternative additives, e.g., glycerol and ethylene glycol, of the present disclosure provide an aqueous alkaline etchant solution that has a comparable or lower reflectance as compared to a pure dilute alkaline etchant solution that does not include any alcohol additive. In one embodiment of the present disclosure, the weighted average reflectance between 400 nm to 1100 nm is from 0.08 to 0.12. In another embodiment of the present disclosure, the weighted average reflectance between 400 nm to 1100 nm is from 0.09 to 0.11. The term "weighted average reflectance" is used throughout the present application to denote the average reflectance weighted to the photon flux density of an AM 1.5 G spectrum. The weighted average reflectance can be determined by reflectance spectroscopy.

Furthermore, the alternative additives of the present disclosure provide an aqueous alkaline etchant solution that has a lower etch rate (typically 10-20%) as compared to the etch rate using a pure dilute alkaline etchant solution that does not include any additive. Since the aqueous alkaline etchant solution with the disclosed additives has a low etch rate associated therewith, there is less overall silicon loss in order to generate the pyramid shaped textured surface having the same reflectance as that processed in a dilute alkaline solution without alcohol additives on a single-crystalline silicon substrate. Such a low Si etching rate can also lengthen the bath life, permitting more silicon wafers to be textured before the bath needs to be replenished with alkaline.

The following examples are provided to illustrate some embodiments of the present disclosure and to also illustrate some of the above mentioned advantages that can be achieved using the aqueous alkaline etchant solution of the present disclosure to texture a surface of a single-crystalline silicon substrate.

EXAMPLE 1

In this example, different aqueous alkaline etchant solutions were prepared and were used for texturing a (100) surface of a single-crystalline silicon substrate. In each case, the single-crystalline silicon substrates were immersed in aqueous alkaline etchant solution at a temperature of 80° C. and were etched for approximately 30 minutes. One of the aqueous alkaline etchant solutions employed was a comparative aqueous alkaline etchant (CE1, labeled as No Alcohol), that included no alcohol additive. CE1 included 1.5 weight % of KOH, 0.5 weight % Si and the remainder water. The remaining two aqueous alkaline etchant solutions were in accordance with the present disclosure. One of aqueous alkaline etchant solutions (S1, labeled as 5% Glycerol) in accordance with the present disclosure included 1.5 weight percent KOH, 0.5 weight percent added Si and 5 weight percent glycerol as an additive. The other aqueous alkaline etchant solution (S2, labeled as 10% Glycerol) in accordance with the present disclosure included 1.5 weight percent KOH, 0.5 weight percent added Si and 10 weight percent glycerol as an additive.

Figure 3:
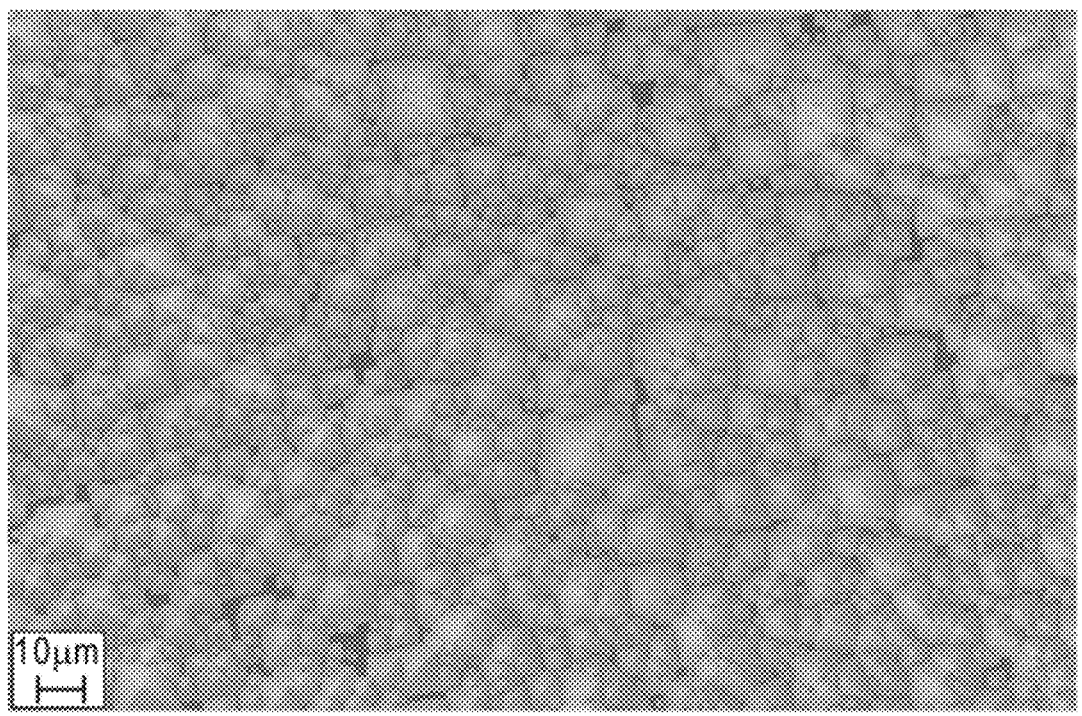
FIG. 3 is a scanning electron microscopic (SEM) photograph at a magnification of 500× showing the textured structure of a single-crystalline silicon substrate formed by using an aqueous alkaline etchant solution containing 1.5 weight percent KOH, 0.5 weight percent added Si and no additive as a comparative example.
Figure 4:
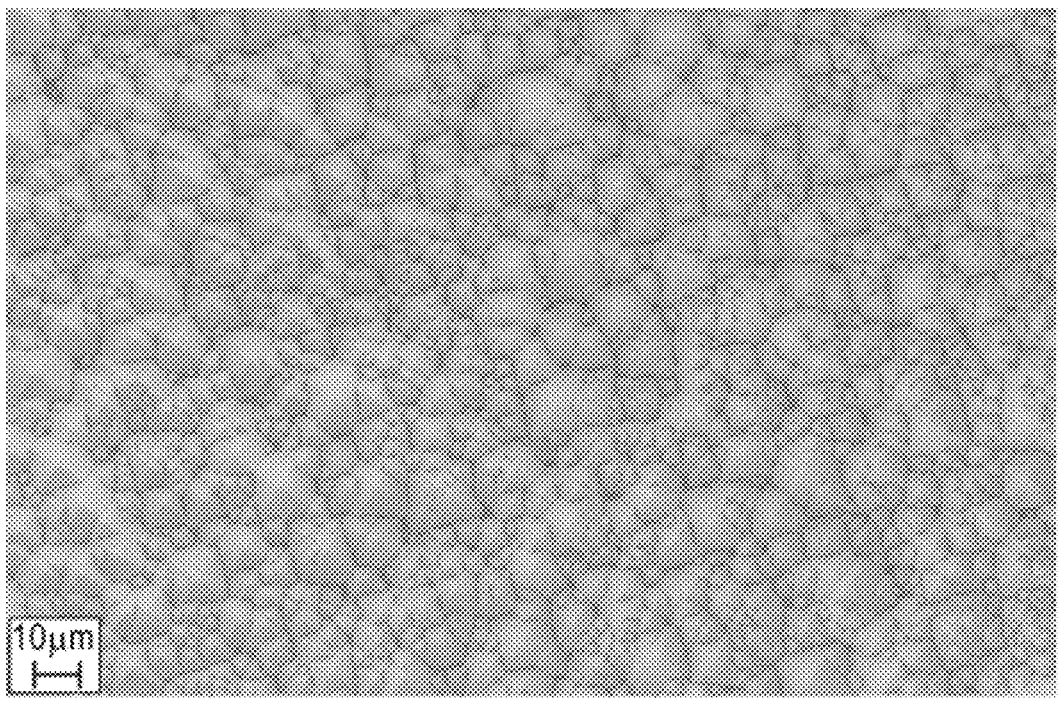
FIG. 4 is a scanning electron microscopic (SEM) photograph at a magnification of 500× showing the textured structure of a single-crystalline silicon substrate formed by using an aqueous alkaline solution etchant containing 1.5 weight percent KOH, 0.5 weight percent added Si and 5 weight percent glycerol as an additive in accordance with one embodiment of the present disclosure.
Figure 5:
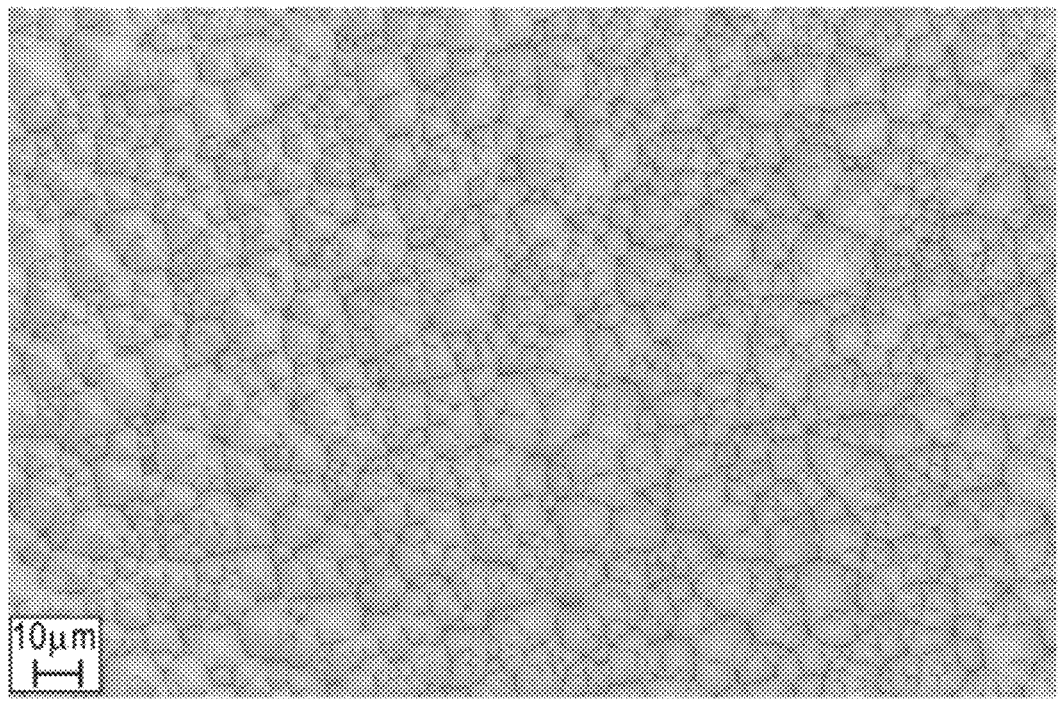
FIG. 5 is a scanning electron microscopic (SEM) photograph at a magnification of 500× showing the textured structure of a single-crystalline silicon substrate formed by using an aqueous alkaline etchant solution containing 1.5 weight percent KOH, 0.5 weight percent added Si and 10 weight percent glycerol as an additive in accordance with one embodiment of the present disclosure.
Figure 6:
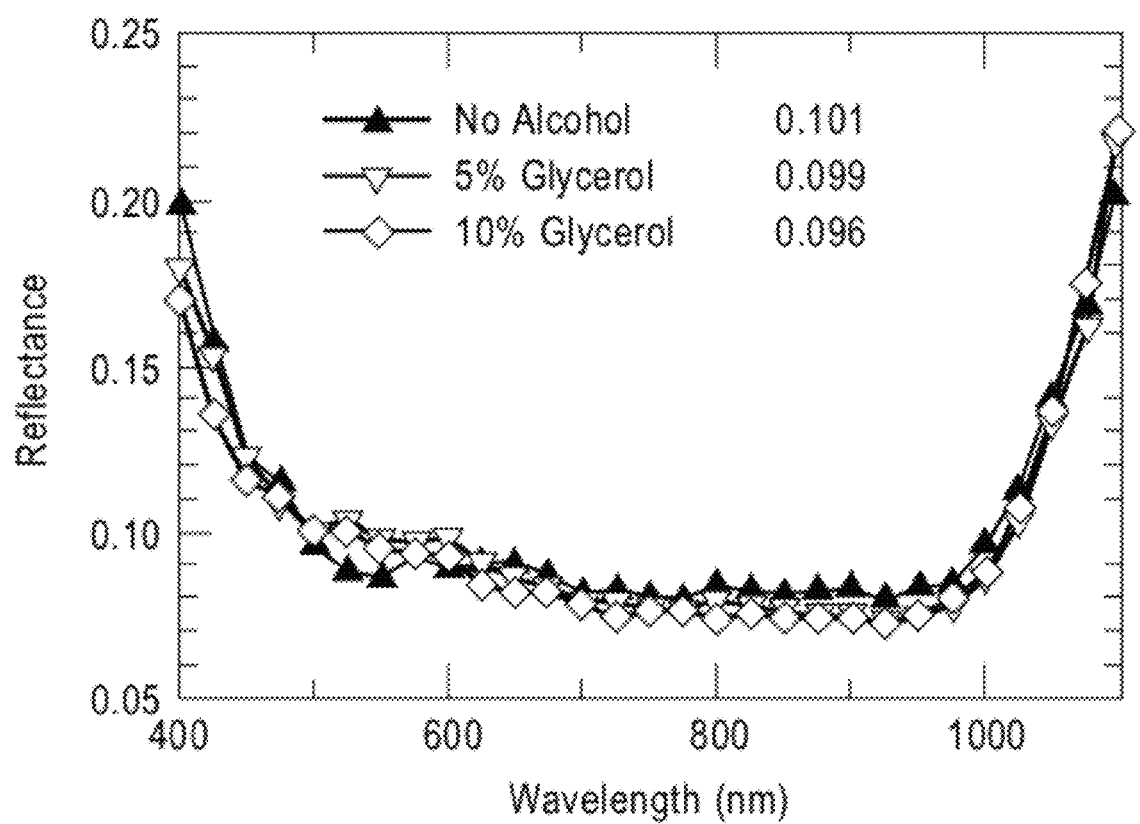
FIG. 6 is a graph of reflectance vs. wavelength (nm) for textured single-crystalline silicon substrates prepared using the aqueous alkaline etchant solutions described in EXAMPLE 1 of the present application.

Reference is now made to FIGS. 3-5 which are actual scanning electron microscopic (SEM) photographs showing the textured structure of various single-crystalline silicon substrates that were formed using CE1, S1 and S2, respectively. FIG. 6 is a graph showing the reflectance spectra from 400 to 1100 nm for the textured single-crystalline silicon substrates illustrated in FIGS. 3, 4 and 5. CE1 (labeled as No Alcohol) had an etch rate of 0.34 µm/min and a weighted average reflectance of 0.101, S1 (labeled as 5% Glycerol) had an etch rate of 0.28 µm/min and a weighted average reflectance of 0.099, while S2 (labeled as 10% Glycerol) had an etch rate of 0.26 µm/min and a weighted average reflectance of 0.096. The data shows that aqueous alkaline etchant solutions in accordance with the present disclosure, S1 and S2, have lower etch rates, yet a comparable weighted average reflectance as compared to CE1.

EXAMPLE 2

Figure 7:
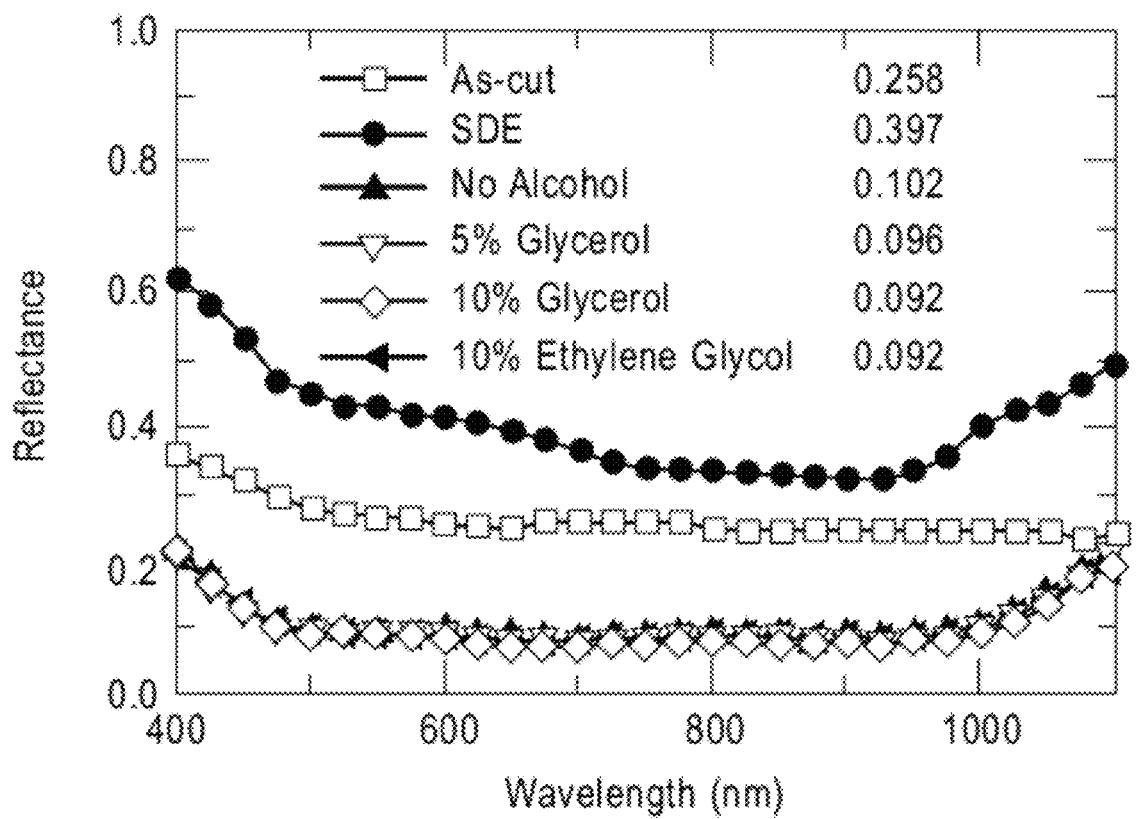
FIG. 7 is a graph of reflectance vs. wavelength (nm) for non-textured and textured single-crystalline silicon substrates prepared as described in EXAMPLE 2 of the present application.

In this example, the reflectance for various non-textured and textured single-crystalline silicon substrates was determined, and is shown in FIG. 7. This example included the following two non-textured single-crystalline silicon substrates: an as-cut single-crystalline silicon wafer (As-cut) and a saw damage etched single-crystalline silicon substrate (SDE), as controlled samples. This example also included four textured single-crystalline silicon substrate. In one of the textured samples, CE1 (labeled as No Alcohol) as mentioned in EXAMPLE 1 was used as the aqueous alkaline etchant solution. In another of the textured samples, S1 (labeled as 5% Glycerol) as mentioned in EXAMPLE 1 was used as the aqueous alkaline etchant solution. In yet another textured sample, S2 (labeled as 10% Glycerol) as mentioned in EXAMPLE 1 was used as the aqueous alkaline etchant solution. In yet a further textured sample, the aqueous alkaline etchant solution, S3 (labeled as 10% Ethylene Glycol) included 1.5 weight percent KOH, 0.5 weight percent added Si and 10 weight percent ethylene glycol as an additive. S3 had an etch rate of 0.29 µm/min. The etch rates for CE1, S1 and S2 were comparable with those mentioned above in EXAMPLE 1.

The weighted average reflectance of the non-textured and textured samples was as shown in the following Table.

TABLE

| | |
|---|---|
| As-Cut | 0.258 |
| SDE | 0.397 |
| CE1 (labeled as No alcohol) | 0.102 |
| S1 (labeled as 5% Glycerol) | 0.096 |
| S2 (labeled as 10% Glycerol) | 0.092 |
| S3 (labeled as 10% Ethylene Glycol) | 0.092 |

The data shows that textured samples all had a lower weighted average reflectance than non-textured samples. Also, the data shows that the aqueous alkaline etchant solutions in accordance with the present disclosure, S1, S2 and S3, have lower etch rates, yet comparable weighted average reflectance as compared to CE1.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a textured silicon surface, said method comprising immersing a single-crystalline silicon substrate into an etchant solution to form a pyramid shaped textured surface, with (111) faces exposed, on said single-crystalline silicon substrate, wherein the etchant solution comprises an aqueous alkaline etchant solution comprising glycerol as an additive.

2. The method of claim 1, wherein said glycerol is present in said aqueous alkaline etchant solution in a concentration of from 3 weight percent to 15 weight percent.

3. The method of claim 1, wherein said glycerol is present in said aqueous alkaline etchant solution in a concentration of from 5 weight percent to 10 weight percent.

4. The method of claim 1, wherein said aqueous alkaline etchant solution further comprises potassium hydroxide (KOH), sodium hydroxide (NaOH), choline hydroxide, tetramethylammonium hydroxide (TMAH) or tetraethylammonium hydroxide (TEAH) as an alkaline component.

5. The method of claim 4, wherein said alkaline component is present in said aqueous alkaline etchant solution in a concentration of from 1 weight percent to 5 weight percent.

6. The method of claim 4, wherein said aqueous alkaline etchant solution further comprises silicon.

7. The method of claim 6, wherein said silicon is present in said aqueous alkaline etchant solution in a concentration of from 0.3 weight percent to 1.5 weight percent.

8. The method of claim 1, wherein said immersing is performed at a temperature from 70° C. to 90° C.

9. The method of claim 1, wherein said single-crystalline silicon substrate has a (100) oriented surface prior to immersing.

10. The method of claim 1, wherein said single-crystalline silicon substrate is a component of a solar cell.

11. A method of forming a textured silicon surface, said method comprising immersing a single-crystalline silicon substrate into an etchant solution to form a pyramid shaped textured surface on said single-crystalline silicon substrate, wherein the etchant solution comprises an aqueous alkaline etchant solution comprising ethylene glycol as an additive.

12. The method of claim 11, wherein said ethylene glycol is present in said aqueous alkaline etchant solution in a concentration of from 3 weight percent to 15 weight percent.

13. The method of claim 11, wherein said ethylene glycol is present in said aqueous alkaline etchant solution in a concentration of from 5 weight percent to 10 weight percent.

14. The method of claim 11, wherein said aqueous alkaline etchant solution further comprises potassium hydroxide (KOH), sodium hydroxide (NaOH), choline hydroxide, tetramethylammonium hydroxide (TMAH) or tetraethylammonium hydroxide (TEAH) as an alkaline component.

15. The method of claim 14, wherein said alkaline component is present in said aqueous alkaline etchant solution in a concentration of from 1 weight percent to 5 weight percent.

16. The method of claim 14, wherein said aqueous alkaline etchant solution further comprises silicon.

17. The method of claim 16, wherein said silicon is present in said aqueous alkaline etchant solution in a concentration of from 0.3 weight percent to 1.5 weight percent.

18. The method of claim 11, wherein said immersing is performed at a temperature from 70° C. to 90° C.

19. The method of claim 11, wherein said single-crystalline silicon substrate has a (100) oriented surface prior to immersing.

20. The method of claim 11, wherein said single-crystalline silicon substrate is a component of a solar cell.

21. An aqueous alkaline etchant solution for texturing a surface of a single-crystalline silicon substrate, said aqueous alkaline etchant solution comprising 1 weight percent to 5 weight percent of an alkaline, 0.3 weight percent to 1.5 weight percent of silicon, 3 weight percent to 15 weight percent of an additive and the remainder water, wherein said alkaline is selected from the group consisting of potassium hydroxide (KOH), sodium hydroxide (NaOH), choline hydroxide, tetramethylammonium hydroxide (TMAH) and tetraethylammonium hydroxide (TEAH), and said additive is selected from the group consisting of glycerol and ethylene glycol.

22. The aqueous alkaline etchant solution of claim 21, wherein said additive is glycerol.

23. The aqueous alkaline etchant solution of claim 21, wherein said additive is ethylene glycol.

* * * * *